United States Patent
Wang et al.

(10) Patent No.: US 7,437,060 B2
(45) Date of Patent: *Oct. 14, 2008

(54) DELIVERY SYSTEMS FOR EFFICIENT VAPORIZATION OF PRECURSOR SOURCE MATERIAL

(75) Inventors: Luping Wang, Brookfield, CT (US); Thomas H. Baum, New Fairfield, CT (US); Chongying Xu, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 493 days.

This patent is subject to a terminal disclaimer.

(21) Appl. No.: 11/157,733

(22) Filed: Jun. 21, 2005

(65) Prior Publication Data

US 2005/0263075 A1  Dec. 1, 2005

Related U.S. Application Data

(63) Continuation of application No. 10/625,179, filed on Jul. 23, 2003, now Pat. No. 6,909,839.

(51) Int. Cl.
*B01D 7/00* (2006.01)
(52) U.S. Cl. ...................... 392/389; 392/386
(58) Field of Classification Search ........................ None
See application file for complete search history.

(56) References Cited

U.S. PATENT DOCUMENTS

| | | | |
|---|---|---|---|
| 1,659,263 A | 2/1928 | Harris |
| 1,679,826 A | 8/1928 | Jenkins |
| 2,047,339 A | 7/1936 | Thomas |
| 2,354,283 A | 7/1944 | St. Clair |
| 2,502,588 A | 4/1950 | Preston et al. |
| 2,553,486 A | 5/1951 | Thomas |
| 2,615,287 A | 10/1952 | Senesky |
| 2,707,484 A | 5/1955 | Rush |
| 2,721,064 A | 10/1955 | Reichardt |
| 2,769,624 A | 11/1956 | Burnside |

(Continued)

FOREIGN PATENT DOCUMENTS

EP  1 508 631 A1  2/2005

(Continued)

OTHER PUBLICATIONS

American National/Compressed Gas Association, Standard for compressed gas cylinder valve outlet and inlet connections, 1994, Compressed Gas Assoc., Inc.

(Continued)

*Primary Examiner*—Thor S Campbell
(74) *Attorney, Agent, or Firm*—Steven J. Hultquist; Intellectual Property/Technology Law; Maggie Chappuis

(57) ABSTRACT

A delivery system for vaporizing and delivering vaporized solid and liquid precursor materials at a controlled rate having particular utility for semiconductor manufacturing applications. The system includes a vaporization vessel, a processing tool and a connecting vapor line therebetween, where the system further includes an input flow controller and/or an output flow controller to provide a controlled delivery of a vaporizable source material to the vaporization vessel and a controlled flow rate of vaporized source material to the processing tool.

20 Claims, 4 Drawing Sheets

U.S. PATENT DOCUMENTS

| | | |
|---|---|---|
| 2,793,504 A | 5/1957 | Webster |
| 3,388,962 A | 6/1968 | Baumann et al. |
| 3,590,860 A | 7/1971 | Stenner |
| 3,658,304 A | 4/1972 | Hall, Jr. et al. |
| 3,699,998 A | 10/1972 | Baranowski |
| 3,791,412 A | 2/1974 | Mays |
| 3,834,682 A | 9/1974 | McPhee |
| 3,972,346 A | 8/1976 | Wormser |
| 3,994,674 A | 11/1976 | Baumann et al. |
| 4,173,986 A | 11/1979 | Martin |
| 4,190,965 A | 3/1980 | Erickson |
| 4,439,463 A | 3/1984 | Miller |
| 4,485,739 A | 12/1984 | Emmett |
| 4,624,443 A | 11/1986 | Eidsmore |
| 4,694,860 A | 9/1987 | Eidsmore |
| 4,744,221 A | 5/1988 | Knollmueller |
| 4,793,379 A | 12/1988 | Eidsmore |
| 4,834,020 A | 5/1989 | Bartholomew et al. |
| 4,836,242 A | 6/1989 | Coffre et al. |
| 4,916,828 A | 4/1990 | Yamane et al. |
| 5,078,976 A | 1/1992 | Shibauchi et al. |
| 5,221,352 A | 6/1993 | Terneu et al. |
| 5,230,359 A | 7/1993 | Ollivier |
| 5,233,837 A | 8/1993 | Callahan |
| 5,289,690 A | 3/1994 | Rockenfeller et al. |
| 5,303,734 A | 4/1994 | Eidsmore |
| 5,409,526 A | 4/1995 | Zheng et al. |
| 5,445,035 A | 8/1995 | Delajoud |
| 5,476,547 A | 12/1995 | Mikoshiba et al. |
| 5,518,528 A | 5/1996 | Tom et al. |
| 5,534,073 A | 7/1996 | Kinoshita et al. |
| 5,547,229 A | 8/1996 | Eidsmore |
| 5,566,713 A | 10/1996 | Lhomer et al. |
| 5,595,209 A | 1/1997 | Atkinson et al. |
| 5,645,192 A | 7/1997 | Amidzich |
| 5,673,562 A | 10/1997 | Friedt |
| 5,678,602 A | 10/1997 | Cannet et al. |
| 5,685,159 A | 11/1997 | Kooy et al. |
| 5,692,381 A | 12/1997 | Garrett |
| 5,694,975 A | 12/1997 | Eidsmore |
| 5,752,544 A | 5/1998 | Yves |
| 5,762,086 A | 6/1998 | Ollivier |
| 5,901,557 A | 5/1999 | Grayson |
| 5,904,771 A | 5/1999 | Tasaki et al. |
| 5,917,140 A | 6/1999 | Tom |
| 5,935,305 A | 8/1999 | Tom et al. |
| 5,937,895 A | 8/1999 | Le Febre et al. |
| 6,007,609 A | 12/1999 | Semerdjian et al. |
| 6,089,027 A | 7/2000 | Wang et al. |
| 6,101,816 A | 8/2000 | Wang et al. |
| 6,107,634 A | 8/2000 | Horsky |
| 6,216,726 B1 | 4/2001 | Brown et al. |
| 6,217,659 B1 | 4/2001 | Botelho et al. |
| 6,257,000 B1 | 7/2001 | Wang |
| 6,270,839 B1 | 8/2001 | Onoe et al. |
| 6,288,403 B1 | 9/2001 | Horsky et al. |
| 6,561,213 B2 | 5/2003 | Wang et al. |
| 6,572,706 B1 | 6/2003 | Nguyen et al. |
| 6,581,915 B2 | 6/2003 | Bartsch et al. |
| 6,607,785 B2 | 8/2003 | Timmons et al. |
| 6,620,225 B2 | 9/2003 | Wang et al. |
| 6,718,126 B2 | 4/2004 | Lei |
| 6,740,586 B1 | 5/2004 | Wang et al. |
| 6,868,869 B2 | 3/2005 | Olander |
| 6,887,337 B2 | 5/2005 | Lebouitz et al. |
| 6,909,839 B2 | 6/2005 | Wang et al. |
| 6,921,062 B2 | 7/2005 | Gregg et al. |
| 2002/0054956 A1 | 5/2002 | Botelho et al. |
| 2002/0192370 A1 | 12/2002 | Metzner et al. |
| 2003/0111014 A1 | 6/2003 | Donatucci et al. |
| 2003/0121608 A1 | 7/2003 | Chen et al. |
| 2005/0006799 A1 | 1/2005 | Gregg et al. |
| 2005/0181129 A1 | 8/2005 | Olander |
| 2006/0024439 A2 | 2/2006 | Tuominen et al. |

FOREIGN PATENT DOCUMENTS

| | | |
|---|---|---|
| FR | 1 575 424 A | 7/1969 |
| JP | 58-126973 A | 7/1983 |
| JP | 60-070176 A | 4/1985 |
| JP | 04-333572 A | 11/1992 |

OTHER PUBLICATIONS

SR4 and SR3 Series Regulators with Operation and Features, Integrated Flow Systems, Inc., 1700 Granite Creek Road, Santa Cruz, CA 95065.

Thomas Directory of American Manufacturers, Photonics Buyer's Guide, 1996, Microwave and RF, and Electronic Engineer's Master Catalogue.

DELIVERY SYSTEMS FOR EFFICIENT VAPORIZATION OF PRECURSOR SOURCE MATERIAL

CROSS-REFERENCE TO RELATED APPLICATIONS

This is a continuation of U.S. patent application Ser. No. 10/625,179 filed Jul. 23, 2003 in the names of Luping Wang, et al. for "Delivery Systems for Efficient Vaporization of Precursor Source Material," issued Jun. 21, 2005 as U.S. Pat. No. 6,909,839.

BACKGROUND OF INVENTION

1. Field of the Invention

The present invention relates to a vapor delivery system, and more particularly, to a system for delivering a controlled and stable vapor flow of vaporized liquid and solid source materials for use in chemical vapor deposition (CVD) and ion implantation processes.

2. Description of the Related Art

Chemical vapor deposition (CVD) has been extensively used for preparation of films and coatings in semiconductor wafer processing. CVD is a favored deposition process in many respects, for example, because of its ability to provide highly conformal and high quality films, at relatively fast processing times. Further, CVD is beneficial in coating substrates of irregular shapes including the provision of highly conformal films even with respect to deep contacts and other openings.

In general, CVD techniques involve the delivery of gaseous reactants to the surface of a substrate where chemical reactions take place under temperature and pressure conditions that are favorable to the thermodynamics of the desired reaction. The type and composition of the layers that can be formed using CVD is limited by the ability to deliver the reactants or reactant precursors to the surface of the substrate. Various liquid precursors are successfully used in CVD applications by delivering the precursor vapor in carrier gas. For example, liquid precursor can be delivered by bubbling carrier gas at a controlled rate through a container of the vaporized precursor. The carrier gas is saturated with vaporized liquid precursor and is then transported to the CVD reaction chamber.

Analogous attempts have been made to deliver solid reactants to a CVD reaction chamber, but with much less success. The delivery of solid precursors in CVD processing is carried out using the sublimator/bubbler method in which the precursor is usually placed in a bubbler reservoir which is then heated to a temperature at which the precursor has a reasonable vapor pressure. The precursor vapor then is transported into the CVD reactor with a carrier gas such as hydrogen, helium, argon, or nitrogen. However, this procedure has proven to be problematic because of the inability to deliver, at a controlled rate, a reproducible flow of vaporized solid precursor to the process chamber.

Similar problems are inherent in conventional ion implantation systems wherein a dopant element is ionized and then subsequently accelerated to form an ion beam directed at a workpiece surface for implantation. In ion implantation processes, there are a number of frequently used dopants, such as arsenic, phosphorus, boron, antimony, indium, etc. Ideally, the dopant is delivered as a gas. However, a solid compound may be delivered via a heated vaporization vessel, which usually does not have any flow control devices. As such, the vapor flow rate often varies with time, due to temperature and changes in the solid surface area.

Solid ion source material is greatly preferred for safety reasons, however, solid semiconductor dopants have presented serious technical and operating problems. For instance, the changing surface area of the bulk solid precursor produces a continuously changing rate of vaporization, particularly for thermally sensitive compounds. This ever-changing rate of vaporization results in a continuously changing and non-reproducible flow of vaporized solid precursor for use in the process chamber. Thus, at present, processes using such vaporized solid precursors cannot be controlled adequately and effectively.

In typical systems used for CVD and ion implantation, it is necessary to precisely meter the output mass flow rate of vaporized constituents. Regulation of vapor mass flow is accomplished in the prior art in various ways. For example, the temperature and pressure of the material in the vaporizer are closely regulated to maintain a constant flow of vapor-phase material. Also, the flow rate of a carrier gas through the vaporizer is controlled in an attempt to completely saturate the carrier gas with vaporized source material. However, these methods still present problems because of the variations in the amount of source material being vaporized within the vessel before combining with the carrier gas.

Accordingly, there is need in the art for a vaporizer system that efficiently vaporizes and delivers vaporized solid or liquid source materials at a highly controllable and reproducible flow rate.

SUMMARY OF THE INVENTION

The present invention relates to a delivery system for vaporizing and delivering of vaporized solid and liquid precursor materials at a reproducible and controlled rate having particular utility for semiconductor manufacturing applications.

In one aspect, the present invention relates to a vapor delivery system for vaporization and delivery of a vaporized source material comprising a vaporization vessel enclosing an interior volume, wherein the vaporization vessel comprises a heating means for vaporizing a source material; an inlet port for introducing a source material and outlet port for discharging vaporized source material; a processing tool positioned downstream from the vaporization vessel, a heatable connecting vapor line positioned between the vaporization vessel and processing tool and in fluid communication therewith; and additionally at least one of the features of:

a) a mass flow controller in fluid communication with the connecting vapor line to provide a controlled flow of vaporized source material from the vaporization vessel to the processing tool;

b) a constant flow control valve in fluid communication with the connecting vapor line, wherein the control valve has an orifice sized to provide a controlled and fixed flow of vaporized source material to the processing tool via the connecting vapor line;

c) an adjustable needle valve connected to the outlet port of the vaporization vessel, wherein the opening of the needle valve is continuously adjusted based on the vapor pressure within the vaporization vessel to provide a controlled and constant flow of vaporized source material to the processing tool via the connecting vapor line;

d) a Knudsen cell structure integral to the vaporization vessel or connected to the outlet port of the vaporization vessel, wherein the Knudsen cell has an orifice sized to provide a controlled and constant flow of vaporized source material to processing tool via the connecting vapor line;

e) a syringe system for accurately delivering a controlled amount of a liquid source material into the vaporization vessel for vaporization therein; or f) a screw delivery device for accurately delivering a solid source material into the vaporization vessel for vaporization therein.

In another aspect, the present invention relates to a vapor delivery system for vaporization delivery of a vaporized source material, comprising:

a) a vaporization vessel for holding a vaporizable source material comprising an input port for introducing a source material and outlet port for discharging vaporized source material; and a vaporization means for vaporizing the vaporizable source material, wherein the vaporization means is selected from the group consisting of an electrical energy emitting device, a liquid heating medium and electromagnetic radiation device emitting wavelengths ranging from about 1 meter to about $10^{-8}$ meter;

b) a processing tool positioned downstream from the vaporization vessel;

c) a connecting vapor line positioned between the vaporization vessel and processing tool and in fluid communication therewith; and additionally at least one of the features of:

1) a mass flow controller in fluid communication with the connecting vapor line to provide a controlled flow of vaporized source material from the vaporization vessel to the processing tool;

2) a constant flow control valve in fluid communication with the connecting vapor line to provide a controlled flow of vaporized source material from the vaporization vessel to the processing tool, wherein the control valve has an orifice sized to provide a fixed flow rate of vaporized source material to the processing tool via the connecting vapor line;

3) an adjustable needle valve connected to the outlet port of the vaporization vessel, wherein the opening of the needle valve is continuously adjusted based on the vapor pressure within the vaporization vessel to provide a controlled and constant flow of vaporized source material to the processing tool via the connecting vapor line;

4) a Knudsen cell structure integral to the vaporization vessel or connected to the outlet port of the vaporization vessel, wherein the Knudsen cell has an orifice sized to provide a controlled and constant flow of vaporized source material to processing tool via the connecting vapor line;

5) a syringe system for accurately delivering a controlled amount of a liquid source material into the vaporization vessel for vaporization therein; or 6) a screw delivery device for accurately delivering a solid source material into the vaporization vessel for vaporization therein.

In yet another aspect of the present invention relates to a vapor delivery system for vaporization and delivery of a vaporized source material, the system comprising:

a) a vaporization vessel for holding a vaporizable source material comprising an input port for introducing a vaporizable source material, an outlet port for discharging vaporized source material, and means for vaporization of the vaporizable source material;

b) a processing tool positioned downstream from the vaporization vessel;

c) a connecting vapor line positioned between the vaporization vessel and processing tool and in fluid communication therewith;

d) input flow control means for introducing a constituent and reproducible flow of a vaporizable source material into the vaporization vessel; and e) output flow control means for delivering a constant flow rate of the vaporized source material from the vaporization vessel to the processing tool.

Still another aspects of the present invention provides for a method for delivering a vaporized source material to a processing tool, the method comprising:

a) introducing a controlled flow of a vaporizable source material into a vaporization vessel;

b) vaporizing a source material in the vaporization vessel to generate a vaporized source material;

c) discharging the vaporized source material from the vaporization vessel; and d) adjusting the flow rate of the discharged vaporized source material by passing through a flow controller to provide a controlled and constant flow of source material to the processing tool.

Other aspects and features of the invention will be more fully apparent from the ensuing disclosure and appended claims.

DETAILED DESCRIPTION OF THE INVENTION AND PREFERRED EMBODIMENTS THEREOF

Figure 1:
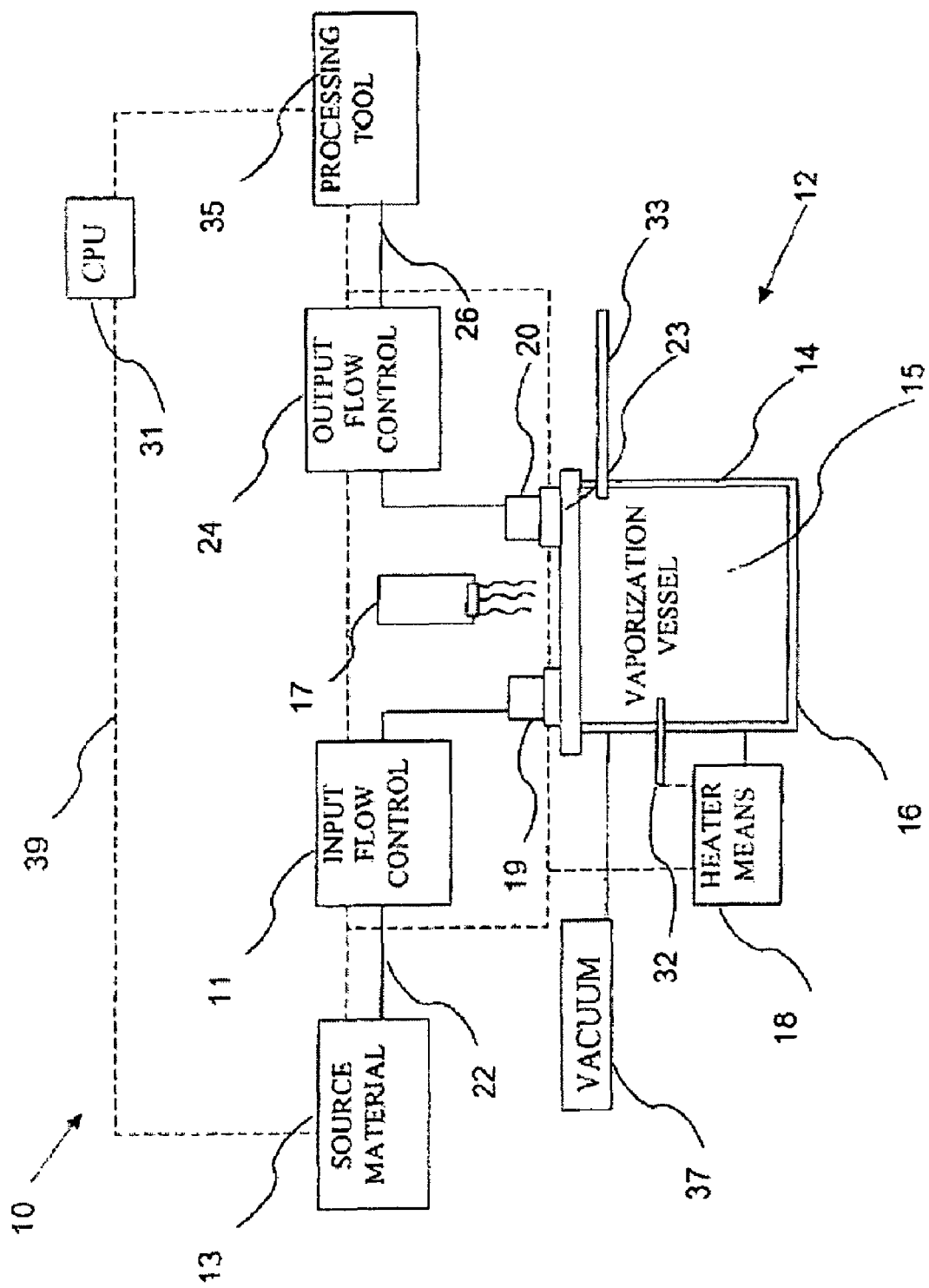
FIG. 1 is a block diagram setting forth the basic components of one embodiment of the vaporization system of present invention.

A delivery system in accordance with one embodiment of the present invention and illustrated in FIG. 1 overcomes the deficiencies of prior art delivery systems for vaporized source materials. The delivery system 10 comprises a vaporization vessel 12, which generally has a shape to facilitate the easy mixing of a carrier gas with the vaporized source material. Preferably, the vaporization vessel has a shape of a sphere, ellipsoid, barrel, cylinder, cone or a combination of these shapes. The vaporization vessel can be fabricated of a suitable heat-conducting material, such as, for example, silver, silver alloys, copper, copper alloys, aluminum, aluminum alloys, lead, nickel clad, stainless steel, graphite and/or ceramic material. The vessel is fabricated from a material that does not chemically react with the source material. Other applicable vaporization vessels are disclosed in copending applications U.S. patent application Ser. Nos. 10/288,743 and 10/201,518, now issued as U.S. Pat. No. 6,740,586 and U.S. Pat. No. 6,921,062, respectively, the entire disclosures of which are incorporated herein by reference.

The vaporization vessel comprises a bottom 16 and sidewalls 14 to form an interior volume 15 for holding a vaporizable source material. Further, the vaporization vessel comprises an inlet port 19 for introducing a source material before initiation of the vaporization process, wherein the source material can be stored in reservoir 13 and optionally introduced by input flow control means 11. The vaporization vessel may further comprise an inlet 33 for introduction of a carrier gas for mixing with the vaporized source material. The carrier gas may be any inert gas, such as argon, helium or neon.

The vaporization delivery system may further comprise a vacuum pump and valve system 37 communicatively connected to the vaporization vessel. The vacuum pump and valve system may be utilized to evacuate the vaporization vessel.

The vapor delivery system of the present invention further comprises a vaporization means to effectuate the vaporization of the source material, wherein the vaporization means may include a heating means 18 to surround at least the bottom and a portion of the side walls of the vaporization vessel. Any heating means that increases the temperature within the vessel to a temperature sufficient to vaporize the desired precursor source material may be used in the present invention. Depending on the vaporizable source material, the operating conditions of the processing tool, the vapor pressure and amount of the vaporizable source material, the temperature suitable for sublimation or vaporization may be in the range from about 30° C. to about 800° C., and more preferably from about 50° C. to about 250° C.

Specifically, the heating device may include resistive heating systems, block heaters, an induction heating coil operated by an rf power supply and/or a circulating liquid medium that transfers heat to the vaporization vessel.

Further, the vaporization energy can be provided by a device that transmits electromagnetic energy 17 having wavelengths ranging from about 1 meter to about $10^{-8}$ and more preferably from about $10^{-2}$ to about $10^{-8}$ meters. Preferably, the vaporization energy utilizes infrared, ultraviolet, or ultrasonic radiation frequencies that may be transmitted into the vaporization vessel through the bottom, sidewall and/or a radiation transparent cover.

Figure 2:
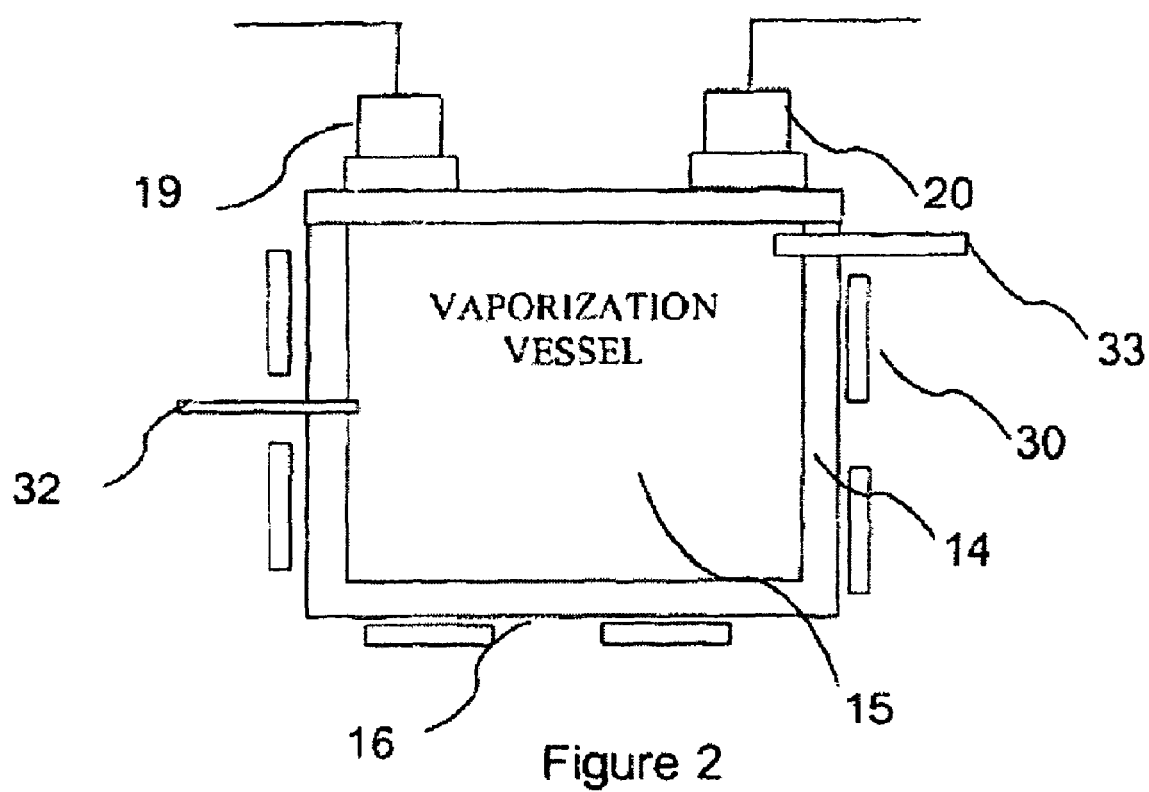
FIG. 2 is a cross-sectional view of a vaporization vessel of the present invention illustrating use of a resistant heating means for vaporization of source material therein.

In one preferred embodiment, as shown in FIG. 2, at least one resistor 30, and more preferably at least four resistors (resistive heating elements), are positioned on the outer surfaces of the vaporization vessel, fabricated as a conductive block, to supply sufficient heat to vaporize the enclosed material and provide a consistent temperature throughout the entire volume of the conductive block. One skilled in the art will be able to adjust the temperature of the vaporizer to achieve the best results for each specific source material. Temperature within the conductive block may be sensed by a thermocouple 32 or any other suitable temperature sensing device arranged for contacting a surface of the thermally conductive block. The system may be arranged as shown in FIG. 1, including a temperature controlling device that obtains an input temperature from the conductive block via thermocouple 32 and outputs a control signal to resistors 30 so that the conductive block is heated and maintained at a suitable temperature.

Figure 3:
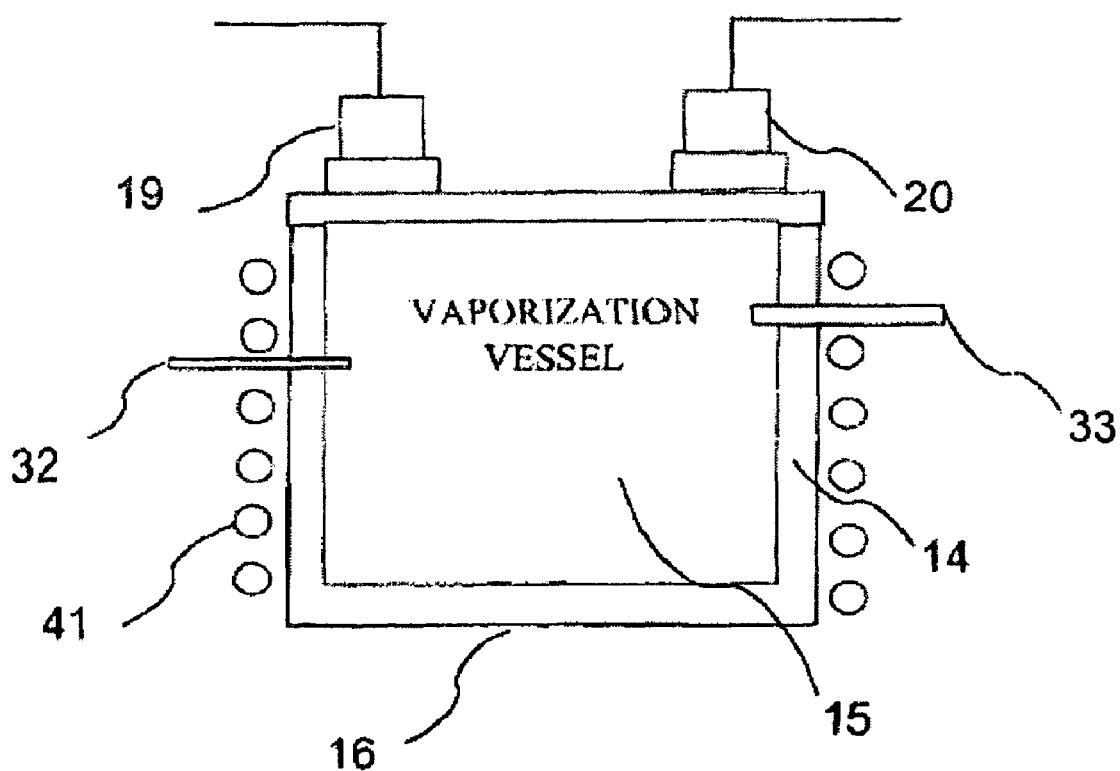
FIG. 3 is a cross-sectional view of a vaporization vessel of the present invention illustrating use of an inductive coil for vaporization of source material therein.

Additionally, vaporization of a source material may be accomplished by surrounding the vaporization vessel with an induction heating coil 41 located external to the vaporization vessel, as shown in FIG. 3. The induction coil may be operated by rf power supply (not shown), which is controlled by feedback from a thermocouple 32 embedded within the vessel. Preferably, the induction coil is positioned to reduce "cold spots" in the vaporizer thereby substantially eliminating deposition and/or condensation of vaporized material within the vaporizer.

Figure 4:
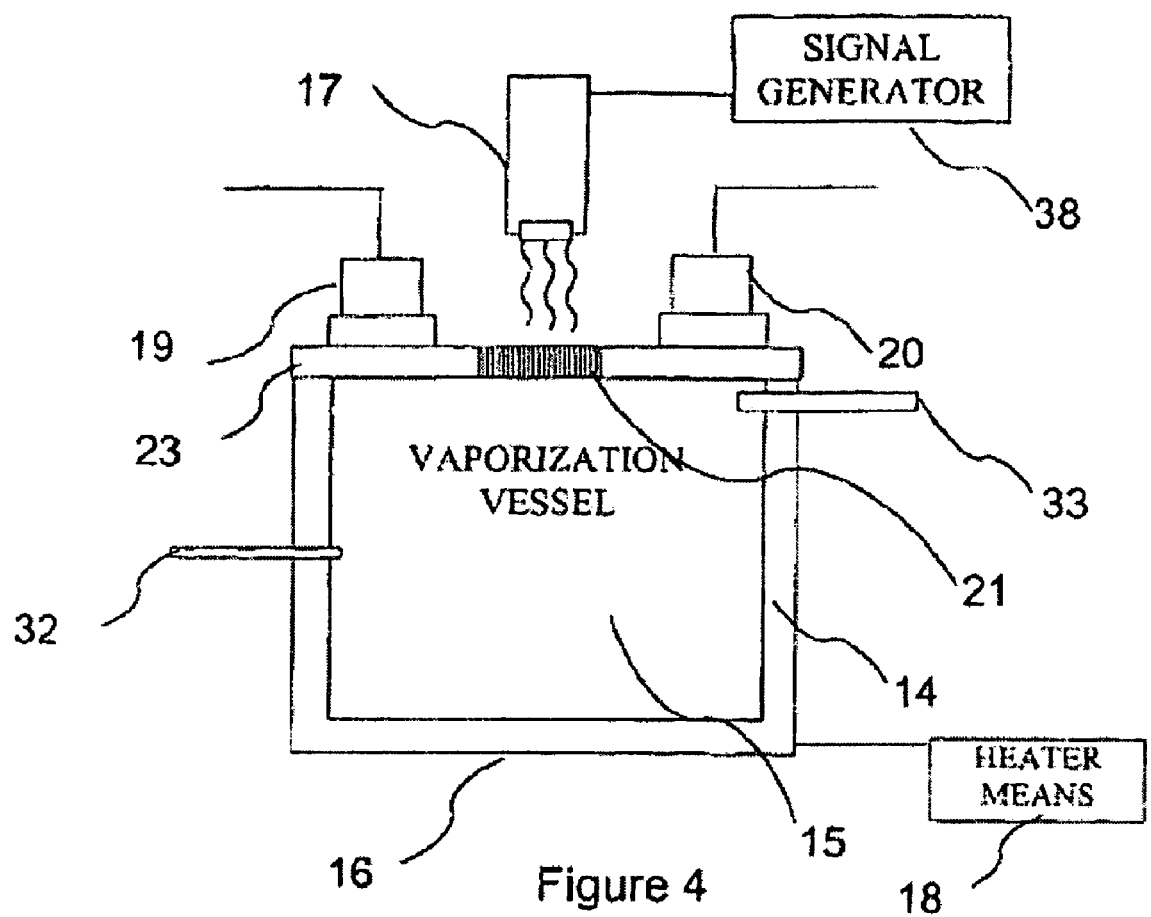
FIG. 4 is a cross-sectional view of a vaporization vessel of the present invention illustrating use of an electromagnetic radiation device for vaporization of source material therein.

Vaporization of a source material may also be achieved by using any device capable of generating and transmitting acoustic energy through any medium to transit ultrasonic atomizing energy. FIG. 4 shows an ultrasonic emitting device 17 that can be used to generate acoustic frequencies for vaporization of a source material. The ultrasonic emitting device can be placed in either the interior of the vaporization vessel or positioned adjacent thereto for transmitting energy into the vaporization vessel. The device may include components for the traditional electromagnetic stimulation of piezoelectric transducers, (man-made or naturally occurring), purely mechanical devices (such as high frequency air whistles), and laser devices. Individual components for acoustic energy systems are commercially available from a wide variety of manufacturers, which can be configured to particular applications and frequency ranges. (See Thomas Directory of American Manufacturers, Photonics Buyer's Guide, 1996, Microwave and RF, and Electronic Engineer's Master Catalogue).

Any oscillator or signal generator 38 that produces a signal with predetermined characteristics such as frequency, mode, pulse duration, shape, and repetition rate may be used to generate acoustic frequencies for vaporization in the present invention. Various oscillators or signal generators can be commercially purchased from a wide variety of manufacturers and in a variety of designs configured to particular applications and frequencies. Applicable transducers will include types that produce an acoustic wave within a range of frequencies (broadband) or for one specific frequency (narrowband) for frequencies ranging from hertz to gigahertz.

The acoustic delivery system will be variable depending on the application. For example, acoustic energy waves can be transmitted into liquid or solid source material either by direct contact of the source material with a transducer, or by coupling of transmission of the acoustic wave through another medium, which is itself in direct contact with the source material. If the source material is a liquid, a transducer can be placed in the liquid source material, or the walls of the vaporization vessel can be fabricated of a material that acts as a transducer thereby placing the liquid source material in direct contact with the transducer. Additionally, an acoustic energy emitting device may be positioned on the exterior of the vaporization vessel for transmitting the appropriate energy through a beam port 21 in upper sealable lid 23 of the vaporization vessel. If the source material is a solid, a transducer can be placed in direct contact with it or the solid source material can be placed in a gas or liquid that is used as a coupling agent.

In the ultrahigh acoustic frequencies (upper GHZ and THz) any laser system that generates acoustic energy may be utilized. If the device is positioned on the outside of the vessel, the ultrasonic device should be positioned at either input port 19 or for transmission through beam port 21 which may be constructed of a frequency transmitting material. Preferably, the output of the ultrasonic generator is of a sufficient frequency to atomize the liquid or solid source material. For example, using the power output of 0.5 to 5 W at a frequency of 40 to 120 kHz, a liquid material can be atomized into fine particles. When an ultrasonic device is utilized, the vaporization vessel may further include a heater means 18 to ensure that the atomized material is completely vaporized before transporting to the processing chamber.

To obtain the maximum transfer of acoustical energy from one medium to another, the characteristic acoustical impedance of each medium is preferably as nearly equal to the other as possible. The matching medium is sandwiched between the other two and should be the appropriate thickness relative to the wavelength of the sound transmitted, and its acoustical impedance R should be nearly equal to $(R_1 R_2)$. Any impedance matching device that is commercially available can be utilized in the present invention.

The vaporization system of the present invention may further comprise a light or laser source for directing an energy beam on the source material. The laser beam may be positioned adjacent to the vaporization vessel for directing the beam through the beam port 21. The laser may be any device capable of focusing an energy beam at a particular point on the solid or liquid source material for vaporization. For example, the laser may transmit infrared or UV energy. If the laser chosen is an IR laser, the beam port window 21 preferably is an IR transparent window formed of an IR transparent material such as, for example, NaCl or CsI.

Figure 5:
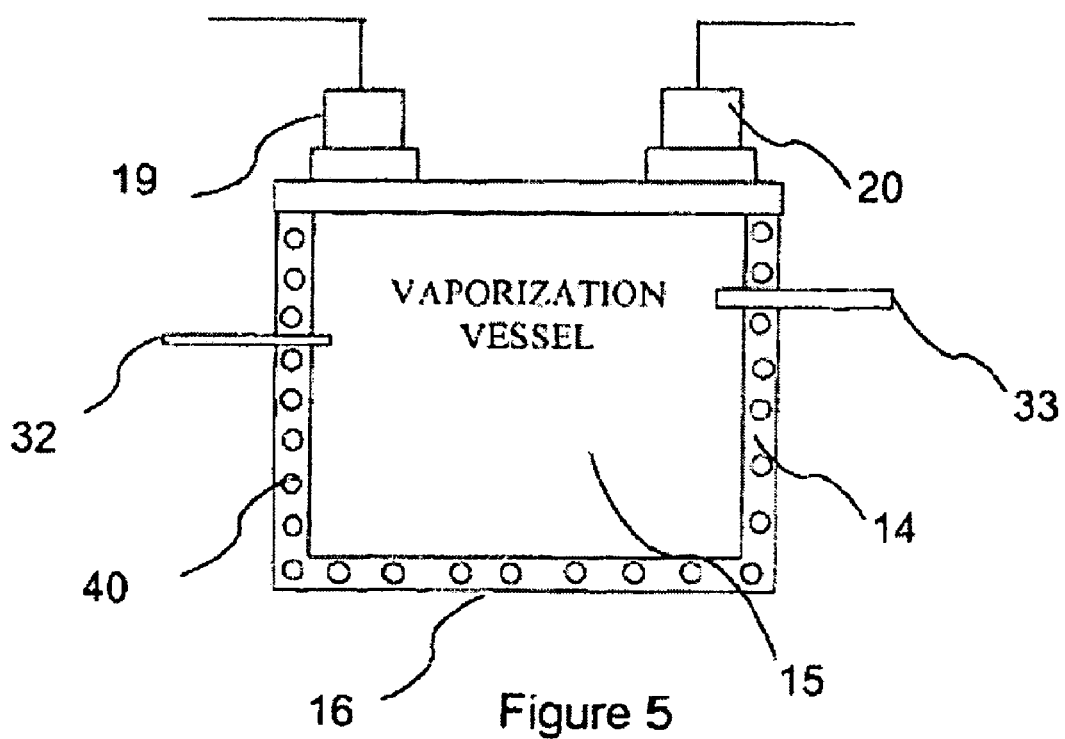
FIG. 5 is a cross-sectional view of a vaporization vessel of the present invention illustrating use of a circulating heat transferring liquid medium for vaporization of source material therein.

FIG. 5 illustrates another type of heating device comprising a liquid heating medium having a high heat capacity to heat the vaporization vessel sufficiently to vaporize the source material therein. The heating medium may comprise, for example, mineral oil or water. The vaporization vessel, as shown in FIG. 5, is properly constructed to accommodate internal tubing 40 within the sidewall and bottom of the vaporization vessel for circulating the heating medium therethrough to provide sufficient transfer of heat to the vaporization vessel for vaporizing the source material therein.

The output flow control means 24, as shown in FIG. 1, comprises at least a valve, a feedback control circuit and an associated proportional solenoid or the like so that the valve can be electronically controlled remotely by a microprocessor (CPU) 31. With particular reference to the individual components, the output flow control means may comprise a rotameter/needle valve assembly for controlling the flow of vaporized source material from outlet port 20 of the vaporization vessel to the processing tool. Preferably, the needle valve is an air-operated device, designed to apply precise and repeatable amounts of vaporized source material dependent on several variables including, valve open time, fluid pressure, flow control adjustment, dispense tip diameter and fluid viscosity. Various needle flow valves for this purpose are commercially available, as will be apparent to those skilled in the art.

In another embodiment, the output flow control means may include a constant flow control valve equipped with an orifice sized to deliver a specific flow rate ranging from about micro-millilters to about liters per minute. The constant flow control valve is in fluid communication with outlet port 20 of the vaporization vessel. Preferably, the orifice of the constant flow control valve is sized proportionally to a fixed flow rate thereby providing a controlled and constant flow of vaporized source material to the processing tool 35 via the connecting vapor line 26. The constant flow control valve may further include a diaphragm which is resiliently biased into a normally closed position, and which shifts to an open position when exposed to a fluid pressure above a predetermined minimum level. Thus, the constant flow valve automatically closes when the fluid delivery pressure is below the predetermined minimum level and automatically opens when the fluid delivery pressures exceeds that minimum level thereby maintaining a substantially constant flow of the vaporized source material through the connecting vapor line 26 to the processing tool. The use of a constant flow control valve, with any of the vaporization vessels discussed in FIGS. 2-5, provides for a flow rate that will remain essentially constant, even with varying pressures ranging from about 15 PSI to 125 PSI and varying fluid viscosities ranging from about 400 SSC to about 700 SSC. Various constant flow control valves for this purpose are commercially available, as will be apparent to those skilled in the art.

In yet another embodiment, the output flow control means may include a mass flow controller (MFC) in fluid communication with output port 20 of the vaporization vessel to control the flow of vaporized source material to the downstream processing tool 35. Depending on the vaporized source material and the final processing system, the flow of material through the mass flow controller may range from about 1 sccm to 50 sccm, and more preferably, from about 1 to about 20 sccm. Positioned in fluid communication with connecting line 26 the mass flow controller, having a variable valve, can accommodate different flow rates, set points and pressures. Preferably, the MFC is communicatively connected to a CPU 31 for adjusting the valve positioning thereby compensating for the pressure and density of the gas that actually is flowing through the MFC to maintain sufficient flow into the processing tool.

Figure 6:
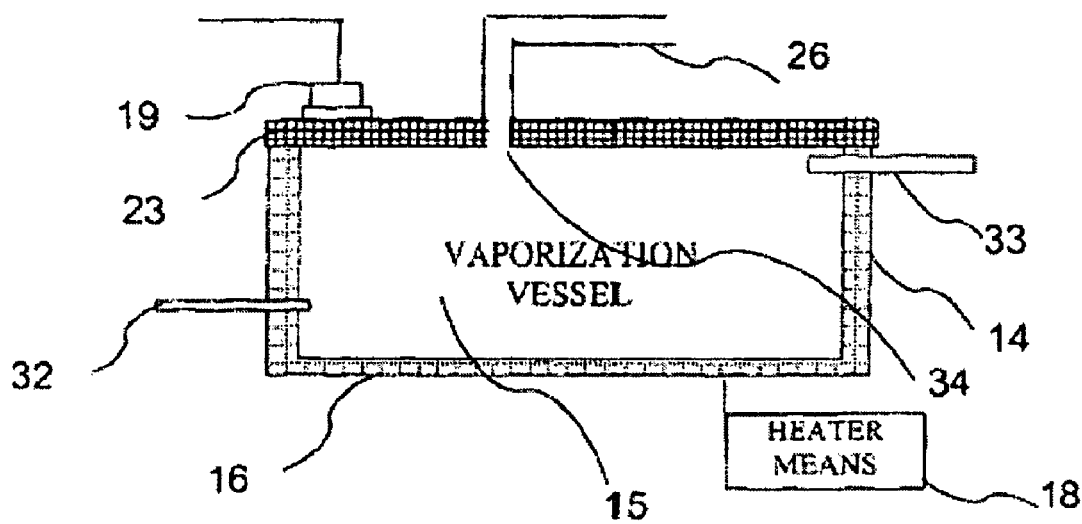
FIG. 6 is a cross-sectional view of a vaporization vessel of the present invention illustrating a Knudsen cell integral to the vaporization vessel for a controlled flow of vaporized source from the vaporization vessel.

The vaporization system of the present invention may further comprise an output flow control valve that is either integral to the vaporization vessel or attached thereto. A Knudsen-type cell structure, as shown in FIG. 6, provides high reproducibility and consistent rates of vaporization thereby providing for consistent flow of vaporized source material from the vaporization vessel for reproducible deposition in the processing tool. The vaporization-Knudsen-type vessel comprises a knife-edge orifice 34 that can be fabricated directly into the vaporization vessel upper cover 23. The size of the orifice is generally determined by the maximum vapor pressure over the sample in the temperature range of interest. The vaporized source material will effuse through the small orifice of the vessel in a consistent flow dependent on the pressure gradient within the vessel. Preferably, the vaporizable surface of the source material within the vessel is large compared to the size of the orifice to maintain an equilibrium pressure within the vaporization vessel. More preferably, the orifice width to the interior cross-sectional area of the vaporization vessel ranges from about 1:100 to about 1:5 and the orifice diameter ranges from about 0.5 to about 50 mm to ensure molecular flow is maintained as the vaporized source material passes through the orifice 34. The shape of the vaporization vessel has a tube-like configuration, which provides sufficient surface area for both solid and liquid source materials.

Temperature within the vaporization-Knudsen-type vessel should be maintained at a constant temperature so that temperature gradients are eliminated. Thus, the internal temperature may be monitored with a thermocoupling 32 positioned within the vessel. Any suitable electrically conductive heat resistive material may be utilized to heat the vaporization vessel. Generally, the resistance heatable vaporization vessels have a resistance range of between about $10^{-2}$ ohms and about $10^3$ ohms. The specific resistivity selected depends upon the electrical power supply utilized and the electrically conductive heat resistant materials used to fabricate the vessel that may include stainless steel, tantalum, tungsten, molybdenum, Hastelloy™, and the like. Any suitable means such as flanges fastened to the vaporization vessel may be utilized to facilitate attachment of electrical connections. The temperature may be controlled by a PID feedback circuit coupled to a SSR to control the temperature within the vessel.

Figure 7:
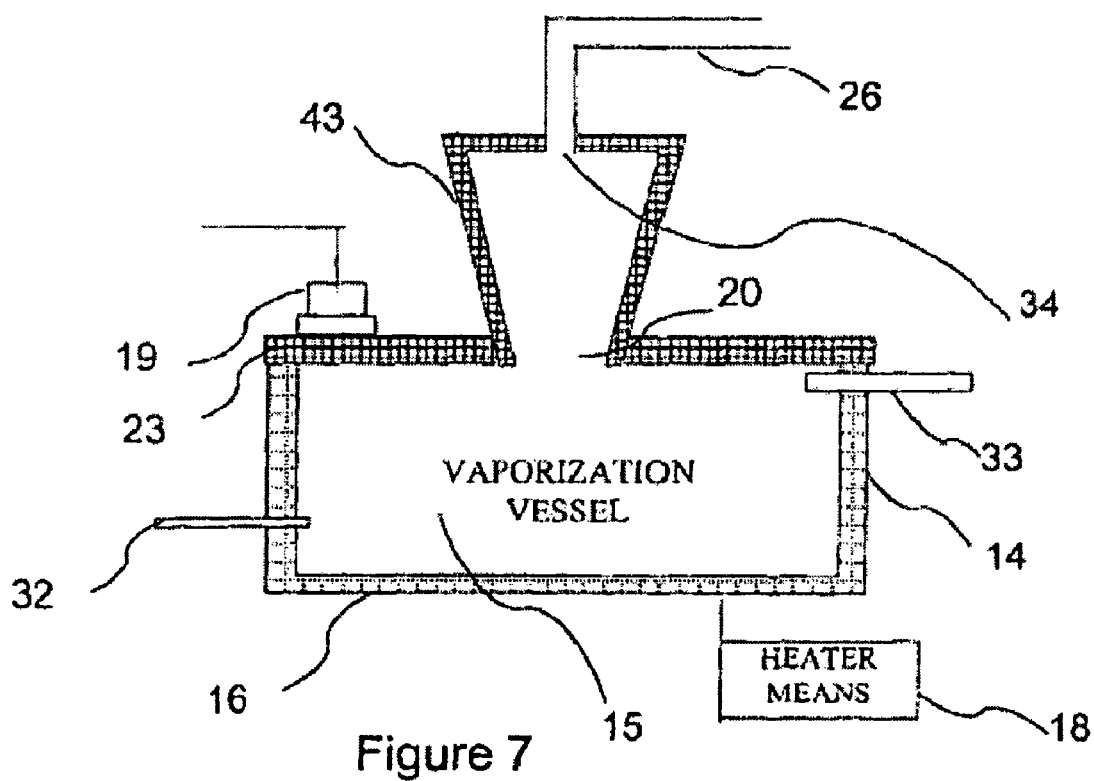
FIG. 7 is a cross-sectional view of a vaporization vessel of the present invention illustrating a separate Knudsen cell connected to the vaporization vessel for a controlled flow of vaporized source material from the vaporization vessel.

FIG. 7 illustrates another embodiment of the present invention wherein a Knudsen-type cell structure 43 is connected to the vaporization vessel through output port 20. The vaporized source material is introduced into the Knudsen type cell structure from the vaporization vessel. The vapors leave the Knudsen-type-cell structure through the orifice 34 having a diameter that will determine the residence time of the molecules. The two separate chambers may be separated by a plunger in order to vaporize a controlled amount of source material vapor in the vaporization vessel 12 and then the vapors effuse into the second chamber 43.

The source material may be introduced into the vaporization vessel 12 via an input flow control means 11 to achieve a precise transfer of source material for vaporization. A liquid source material may be introduced by utilizing a syringe-type piston pump that is capable of delivering an accurate liquid delivery rate which in turn provides an accurate vapor flow rate when the liquid source material vaporizes in the vaporization vessel. For a solid source material, an accurate and constituent delivery amount may be achieved by utilizing a screw delivery device that delivers accurate and repeatable dots or beads of the source material to the heated vaporization vessel. Any commercially available positive displacement screw device may be utilized in the present invention.

Introduction of the source material to the vaporization vessel and flow of the vaporized source material between the vaporizer and processing chamber is controlled by the CPU 31. As shown in FIG. 1, the CPU may be arranged to actuate the input and output flow controllers and/or monitor heating temperature and pressure within the vaporization vessel by means of a signal transmission line 39, which convey signals received from various other components to the CPU.

While the invention has been described herein with reference to specific features, aspects and embodiments, it will be recognized that the invention may be widely varied, and that numerous other variations, modifications and other embodiments will readily suggest themselves to those of ordinary skill in the art. Accordingly, the ensuing claims are to be broadly construed, as encompassing all such other variations, modifications and other embodiments, within their spirit and scope.

What is claimed is:

1. A vapor delivery system for vaporization and delivery of a vaporized source material comprising a vaporization vessel enclosing an interior volume, wherein the vaporization vessel comprises a heater for vaporizing a source material; an inlet port for introducing a source material and an outlet port for discharging vaporized source material; a processing tool positioned downstream from the vaporization vessel; a connecting vapor line positioned between the vaporization vessel and processing tool and in fluid communication therewith; and additionally at least one flow control feature comprising:
   a) a mass flow controller in fluid communication with the connecting vapor line to provide a controlled flow of vaporized source material from the vaporization vessel to the processing tool;
   b) a constant flow control valve in fluid communication with the connecting vapor line, wherein the control valve has an orifice sized to provide a controlled and constant flow of vaporized source material to the processing tool via the connecting vapor line;
   c) an adjustable needle valve connected to the outlet port of the vaporization vessel, wherein the opening of the needle valve is continuously adjusted based on the vapor pressure within the vaporization vessel to provide a controlled and constant flow of vaporized source material to the processing tool via the connecting vapor line;
   d) a Knudsen cell structure integral to the vaporization vessel or connected to the outlet port of the vaporization vessel, wherein the Knudsen cell has an orifice sized to provide a controlled and constant flow of vaporized source material to processing tool via the connecting vapor line;
   e) a syringe system for accurately delivering a controlled amount of a liquid source material into the vaporization vessel for vaporization therein; or
   f) a screw delivery device for accurately delivering a solid source material into the vaporization vessel for vaporization therein.

2. The vapor delivery system according to claim 1, wherein the system comprises Knudsen cell structure integral to the vaporization vessel.

3. The vapor delivery system according to claim 1, further comprising a central processing unit communicatively linked to the at least one control feature for adjustment of flow into or out of the vaporization vessel.

4. The vapor delivery system according to claim 1, further comprising a carrier gas source in fluid communication with the vaporization vessel.

5. The vapor delivery system according to claim 1, wherein the system comprises a Knudsen cell structure connected to the outlet port of the vaporization vessel.

6. The vapor delivery system according to claim 1 further comprising a heater for heating the connecting vapor line.

7. The vapor delivery system according to claim 1, wherein the system comprises the mass flow controller and the screw delivery device.

8. The vapor delivery system according to claim 6, wherein the heater is selected from the group consisting of electrical, liquid, and electromagnetic radiation having wavelengths from $10^{-2}$ to $10^{-8}$ meters.

9. The vapor delivery system according to claim 1, wherein the system comprises the constant flow control valve and the system is heated by an ultrasonic laser positioned adjacent to the vaporization vessel.

10. The vapor delivery system according to claim 1, wherein the system comprises a Knudsen cell structure connected to the outlet port of the vaporization vessel and a mass flow control valve.

11. A vapor delivery system for vaporization delivery of a vaporized source material, comprising:
   a) a vaporization vessel for holding a vaporizable source material comprising an input port for introducing a source material and an outlet port for discharging vaporized source material; and a vaporizer for vaporizing the vaporizable source material, wherein the vaporizer is selected from the group consisting of an electrical energy emitting device, a liquid heating medium and electromagnetic radiation device emitting wavelengths ranging from about $10^{-2}$ to about $10^{-8}$ meters;
   b) a processing tool positioned downstream from the vaporization vessel;
   c) a connecting vapor line positioned between the vaporization vessel and processing tool and in fluid communication therewith; and additionally at least one of the features of:
      1) a mass flow controller in fluid communication with the connecting vapor line to provide a controlled flow of vaporized source material from the vaporization vessel to the processing tool;

2) a constant flow control valve in fluid communication with the connecting vapor line, wherein the constant flow control valve has an orifice sized to provide a controlled and constant flow of vaporized source material to the processing tool via the connecting vapor line;

3) an adjustable needle valve connected to the outlet port of the vaporization vessel, wherein the opening of the needle valve is continuously adjusted based on the vapor pressure within the vaporization vessel to provide a controlled and constant flow of vaporized source material to the processing tool via the connecting vapor line;

4) a Knudsen cell structure integral to the vaporization vessel or connected to the outlet port of the vaporization vessel, wherein the Knudsen cell has an orifice sized to provide a controlled and constant flow of vaporized source material to processing tool via the connecting vapor line 5) a syringe-type pump system for accurately delivering a controlled amount of a liquid source material into the vaporization vessel for vaporization therein; or 6) a screw delivery device for accurately delivering a solid source material into the vaporization vessel for vaporization therein.

12. The vapor delivery system according to claim 11, wherein the system comprises a syringe for introducing a control amount of source material to the vaporization vessel and a mass flow controller for controlling the amount of vaporized source material introduced into process tool.

13. The vaporized delivery system according to claim 12, wherein the heater comprises resistance heater.

14. The vapor delivery system according to claim 11, wherein the system comprises a syringe for introducing a control amount of source material to the vaporization vessel and a Knudsen-type-cell structure for controlling the amount of vaporized source material introduced into process tool.

15. The vapor delivery system according to claim 11, wherein the system comprises a screw device for introducing a control amount of source material to the vaporization vessel and a Knudsen-type-cell structure for controlling the amount of vaporized source material introduced into process tool.

16. The vapor delivery system according to claim 15, wherein the heater to heat the Knudsen-type-cell structure comprises a resistance heater.

17. A vapor delivery system for vaporization and delivery of a vaporized source material, the system comprising:
    a) a vaporization vessel for holding a vaporizable source material comprising an input port for introducing a source material; an outlet port for discharging vaporized source material; and a vaporizer for vaporizing the vaporizable source material within the vaporized vessel;
    b) a processing tool positioned downstream from the vaporization vessel;
    c) a connecting vapor line positioned between the vaporization vessel and processing tool and in fluid communication therewith;
    d) an input flow controller for introducing a constituent and reproducible flow of a vaporizable source material into the vaporization vessel; and
    e) an output flow controller for delivering a constant flow rate of the vaporized source material from the vaporization vessel to the processing tool.

18. The vapor delivery system according to claim 17, wherein the system comprises a syringe for introducing a control amount of source material to the vaporization vessel and a constant control valve for controlling the amount of vaporized source material introduced into process tool.

19. The vapor delivery system according to claim 17, wherein the system comprises a screw delivery device for introducing a control amount of source material to the vaporization vessel and a Knudsen-type-cell structure for controlling the amount of vaporized source material introduced into process tool.

20. The vapor delivery system according to claim 19, wherein the vaporizer comprises ultrasonic energy.

* * * * *